US010385446B2

(12) United States Patent
Khisamov

(10) Patent No.: US 10,385,446 B2
(45) Date of Patent: Aug. 20, 2019

(54) THIN FILM COATING METHOD AND THE MANUFACTURING LINE FOR ITS IMPLEMENTATION

(71) Applicant: Ayrat Khamitovich Khisamov, Ufa (RU)

(72) Inventor: Ayrat Khamitovich Khisamov, Ufa (RU)

(73) Assignee: THE BATTERIES SP. Z.O.O., Rzeszow (PL)

( * ) Notice: Subject to any disclaimer, the term of this patent is extended or adjusted under 35 U.S.C. 154(b) by 209 days.

(21) Appl. No.: 15/101,891

(22) PCT Filed: Jan. 14, 2014

(86) PCT No.: PCT/RU2014/000010
§ 371 (c)(1),
(2) Date: Jun. 3, 2016

(87) PCT Pub. No.: WO2015/108432
PCT Pub. Date: Jul. 23, 2015

(65) Prior Publication Data
US 2016/0333467 A1    Nov. 17, 2016

(51) Int. Cl.
C23C 14/50 (2006.01)
C23C 14/56 (2006.01)
C23C 14/24 (2006.01)

(52) U.S. Cl.
CPC ............ *C23C 14/566* (2013.01); *C23C 14/24* (2013.01); *C23C 14/505* (2013.01); *C23C 14/56* (2013.01)

(58) Field of Classification Search
CPC ....... C23C 14/24; C23C 14/505; C23C 14/56; C23C 14/566; B05D 1/002
See application file for complete search history.

(56) References Cited

U.S. PATENT DOCUMENTS 4,851,095 A    7/1989 Scobey et al.
5,618,388 A *  4/1997 Seeser .................. C23C 8/02
                                              118/719
(Continued)

Primary Examiner — Kirsten Jolley
(74) Attorney, Agent, or Firm — John Alumit

(57) ABSTRACT

A group of inventions is related to process equipment to process surfaces in mass production, particularly, vacuum process equipment to apply thin film coatings with set optical, electrical and other parameters.
The technical result is to ensure a capability of processing flexible large substrates, as well as small substrates with a high degree of coating uniformity, with an ability to utilize a wide range of technologies and process devices, as well as to have a highly effective useful operation of applied materials.
The proposed technical result is obtained by a method of applying thin film coatings on substrates, which are placed on rotating drums, which consequently move along the processing zones with the same constant linear and angular speeds.
Furthermore, a ratio between the linear and angular speeds of the drum is selected so that each surface point of the drum will complete at least two full revolutions while passing through the processing zone.
Also, the proposed technical result is also achieved by the fact that within the manufacturing line for applying the thin film coatings, consisting of the inlet airlock chamber, process chamber with at least one process device within it, which forms a processing zone, outlet buffer chamber, transportation system and substrate holder, designed to move along chambers, a substrate holder designed as a carriage with a cylinder installed on it, positioned coaxially toward the movement direction of the carriage and designed to rotate, while the angular rotational velocity and linear speed of the movement, during the processing, will be constant and selected so that each surface point of the cylinder will complete at least two full revolutions while
(Continued)

passing through the processing zone. Furthermore, the transportation system will be equipped with rollers, and carriage with guides that interact with rollers.

4 Claims, 3 Drawing Sheets

(56) References Cited

U.S. PATENT DOCUMENTS

| | | | |
|---|---|---|---|
| 6,485,616 B1* | 11/2002 | Howard | C23C 14/505 |
| | | | 118/728 |
| 2002/0029443 A1* | 3/2002 | Ortiz | A44B 11/006 |
| | | | 24/615 |
| 2003/0033983 A1 | 2/2003 | Song et al. | |
| 2009/0081885 A1 | 3/2009 | Levy et al. | |
| 2013/0112546 A1* | 5/2013 | Brown | C23C 14/56 |
| | | | 204/192.12 |
| 2013/0287526 A1* | 10/2013 | Bluck | H01L 21/67739 |
| | | | 414/217 |

* cited by examiner

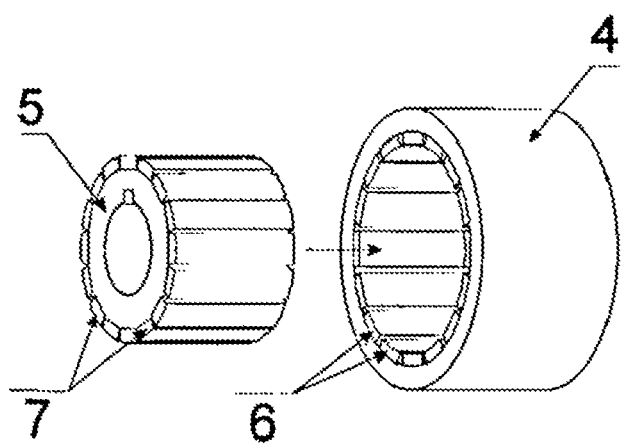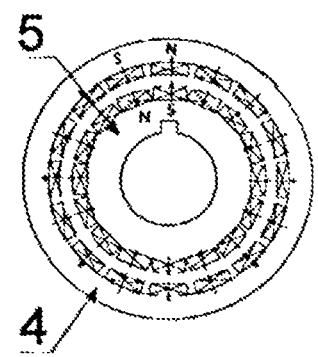
Fig. 4
Fig. 5

THIN FILM COATING METHOD AND THE MANUFACTURING LINE FOR ITS IMPLEMENTATION

CROSS-REFERENCE TO RELATED APPLICATION

This application is a national stage patent application arising from PCT/RU2014/000010 filed on Jan. 14, 2014, and referenced in WIPO Publication No. WO2015/108432. The earliest priority date claimed is Jan. 14, 2014.

FEDERALLY SPONSORED RESEARCH

None

SEQUENCE LISTING OR PROGRAM

None

Pertinent Art

This group of inventions is related to the process equipment field to process surfaces in mass production, particularly, vacuum process equipment, designated for thin film coating with set optical, electrical and other properties.

Previous Technology Level

From the technical level, there are various methods of thin film coatings on processed goods (substrates).

U.S. Pat. No. 4,851,095, published in Jul. 25, 1989, describes the method of magnetron deposition of thin film coatings on substrates, placed on a rotating drum. The coating deposition on substrates is implemented by operating devices within the vacuum chamber around the drum.

Deficiencies of this technical solution are low productivity and significant cost of goods due to the need to repeat process operations to achieve the required quantity of layers in the structure.

The closest one by combination of significant features to the proposed method is shown in the U.S. Pat. No. 6,893,544, published on May 17, 2005, a method of applying thin-film coatings, in which the substrates are fastened to a vertical flat carriage, moving in the linear type of the process equipment (magnetron deposition cathodes, linear sources of plasma, etc.).

Deficiencies of this method are high cost and low productivity, especially when applying complex and precise coatings, due to the need to use complicated control systems and settings (i.e. overhead time and materials), high material consumption, due to the processing area of the process equipment is higher than the uniformity area, and, for example, during magnetron deposition, 30-50% of target material misses the substrate, as well as the limited zone of applicable process equipment, since we can only use such equipment that ensures an acceptable uniformity, which excludes a wide range of perspective technologies.

From this level of technology, we also know of various equipment for application of thin film coatings on processed goods (substrates). Particularly, to process small size substrates in mass production, periodic action drum devices are used, for example, such as a device, described in U.S. Pat. No. 4,851,095, published on Jul. 25, 1989, which includes a cylindrical substrate holder, with substrates around it. Coating uniformity in one direction is ensured by a drum rotation, while in another direction by using linear process equipment.

In display production, where flat substrates are processed, an in-line type of equipment is used. As an example of such equipment, where substrates are fastened to the carriage, moving along subsequent process stages, we may refer to an automated device for forming thin film coatings, described in the patent of the utility model RU 78785, published on Dec. 10, 2008. However, this equipment, just like any other equipment known today, has such deficiencies as low operational reliability due to dependency of reliable fastening to substrates on smooth movement of a transportation system, as well as high cost due to complex control systems and settings to ensure the required uniformity of application onto surfaces.

The closest one to this invention, by overall significant parameters, is the process line for deposition of thin film coatings, described in U.S. Pat. No. 6,893,544, published on May 17, 2005, which includes the consequently placed airlock chamber, processing chamber, with processing equipment within it, buffer chamber and flat substrate holder, designed to move along the chambers.

This technical solution has the following deficiencies:

Limited range of standard sizes of treatable substrates, particularly an inability to process flexible substrates, for example, thin glass due to an inability to ensure their reliable hold and protection when moving along the manufacturing line;

high cost due to complicated control systems and settings, especially for complex and precise coatings, as well as significant material consumption, 30-50% of which misses the substrate due to provision of uniformity of deposited layer at the expense of the process zone of manufacturing equipment being larger than the uniformity zone;

limited range of applicable technologies and process equipment, since a possible application is limited by requirements of acceptable uniformity of deposited layer.

Discussion of Group of Inventions

The challenge that a present group of inventions is focused on is the creation of high-productivity unified equipment to process substrates with a wide range of standard sizes.

When this challenge is solved, the technical result is achieved, which ensures the possibility of processing flexible large substrates, as well as small substrates with high degree of uniform coverage with ability to use a wide range of technologies and process equipment, as well as with high efficiency of value-added use of applied materials.

The mentioned technical result is achieved by having a method of applying thin film coatings on substrates, which would be held by holders and consequently moving holders with substrates through processing chambers, within which the coating is applied by processing equipment, located within processing chambers. Furthermore, the substrate holders are designed as rotating drums, which move through the processing zones of processing equipment, parallel to the rotating axis of the drums, and rotate with constant linear and angular velocities, while the ratio of linear and angular velocities is selected from the condition that calls for every point of the drum surface would make at least two full revolutions when going through a processing zone of the processing equipment.

The mentioned technical result is also achieved by having the thin film coating manufacturing line with airlock and buffer chambers, and at least one processing chamber with processing equipment, substrate holders, positioned on carriages, installed as to have an ability to pass through chambers, and transportation system. Furthermore, the substrate holders are designed as rotating drums, which move through the processing zones of processing equipment, positioned on the carriage coaxially to the direction of its movement, and rotate with constant linear and angular velocities, and ensuring at least two full revolutions of every point of the drum surface when going through a processing zone of the processing equipment.

To achieve this technical result, the manufacturing line may contain inlet and outlet airlock and buffer chambers. Furthermore, the substrate holder carriage may be designed as a hanger, positioned above the substrate holder, or as a frame, or as a cart with linear guides, positioned under the substrate holder. The manufacturing line may also be equipped, at least, with one drive to rotate substrate holders. Substrate holders may be equipped with frictional and/or magnetic removable couplings and/or low voltage electric motor. Furthermore, every substrate holder may be equipped with an electric motor, the transportation system may be equipped with rollers, and the carriage may be equipped with guides that interact with rollers.

The principle of achieving uniformity, created by design, is explained in the case of the description of the movement of the cylindrical holder that makes an even rotating and forward movement through the processing zone of one processing equipment. When the cylinder is moving, on every point of the overall cylinder surface, for every revolution, some coating thickness f(x) will be applied. At every revolution, every observed point A will shift by a shifting step of cylinder d to point A', and at a following revolution, it will have a coating thickness corresponding to point A'. An overall thickness T, applied at point A, after passing through the entire processing zone, will be obtained by the sum of values of the plot chart at points with step d. This summation is equivalent to the integration of the graph of midpoint rule method with step d. For another point B, there is the same summation, but by another point selection. Meaning that for every point, the evaluation of fully applied thickness is given by $T_0=S/d$, where S is an area under the graph. The precision of this evaluation rises with a reduction in step proportional to its quadrature. An evaluation of a relative error is given by the expression $$R \le \frac{M_2}{24 f_{cp}} d^2,$$

where $f_{cp}$ is an average value of f(x), $M_2$ is maximum value of f'(x). This evaluation is an evaluation of coating thickness non-uniformity at the conditions of stable operation of process equipment.

When using N identical process equipment, equidistantly positioned around substrate holders, the previous estimate holds true, referenced for a single process equipment, which is repeatable, numbering process equipment consequently from 1 to N. Furthermore, for every point, the inlet of k-process equipment will be determined by the total of values at points, shifted relative to the first by $$d \times \frac{k-1}{N}.$$

If we were to combine all points of summation now, then it will mean that we are summing values at points with step d/N. Meaning that an application of such configuration of equipment is equivalent to an integration N times, and, accordingly, to an improvement $N^2$ times.

The required uniformity may be achieved by the following:

several identical process equipment positioned symmetrically around substrate holders;

several identical process equipment with step S=(m+1/n)*d, where m is a whole number, n is a number of devices, d is a linear shift of a substrate holder per time of one revolution, may be positioned along the way of substrate holders;

a part of deposition zone may be masked by a lid, controlled externally. Regarding the uniformity principle, it is necessary to point out that, if required, substrate holders may move through processing chambers with various speed and only have a constant speed in the processing zone. An ability to move substrate holders within one processing chamber with various speed: even and constant in the processing zone and another speed outside of the processing zone, but within limits of that processing chamber, ensures an optimization of manufacturing line components due to an ability to use the required, in accordance with design, processing chambers, which in turn will increase the manufacturing line productivity.

BRIEF DESCRIPTION OF DRAWINGS

This group of inventions is illustrated by drawings, where:

FIG. 4 shows components of the magnetic coupling in a block diagram;

FIG. 5 shows the front view of the magnetic coupling;

IMPLEMENTATION OF THE GROUP OF INVENTIONS

The proposed application of thin film coatings on substrates may be represented by an example of arrangement of process equipment line to apply the four-layer antireflective coating on glass. Layer uniformity requirements are ±1% for the first and second layer, and ±3% for the third and fourth layers.

The length of a substrate holder is 100 cm. The movement speed of holders in the processing zone is determined by the cycle of the line and is 1 m/min. To apply coating, four processing zones were established, one zone per each layer. Medium frequency magnetrons with 800 mm target distance were used as process equipment. The number of process equipment is determined by manufacturing requirements and layer thickness. One process device 01 is used to apply the first layer (magnesium oxide), two process devices 02 for the second layer application (titanium oxide), four process devices of each of 03 and 04 to apply third (magnesium oxide) and fourth (titanium oxide) layers, respectively.

Since first two layers have stricter uniformity requirements, and a small number of process devices are used to apply the first layer, the needed rotational velocity for uniformity will be determined by the first layer.

Figure 1:
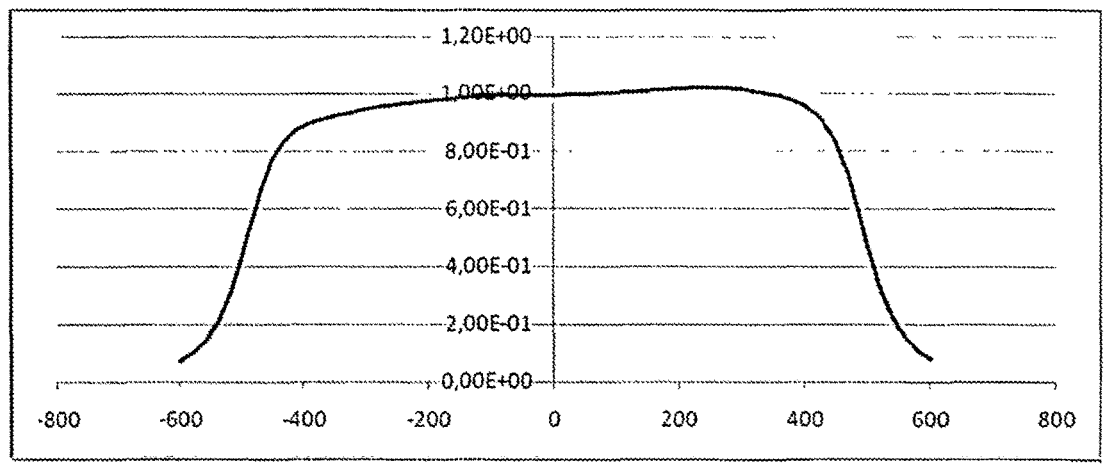
FIG. 1 shows the distribution graph of the applied thickness per one revolution from a single processing device, shown on the graph (coordinates along the X-axis in mm, from the center of the device)
Figure 2:
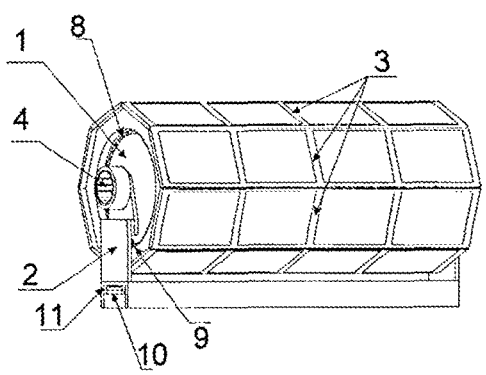
FIG. 2 shows substrate holders in a block diagram.
Figure 3:
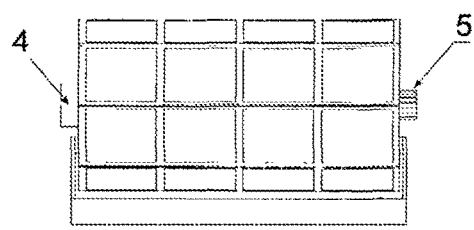
FIG. 3 shows the front view of substrate holders.
Figure 6:
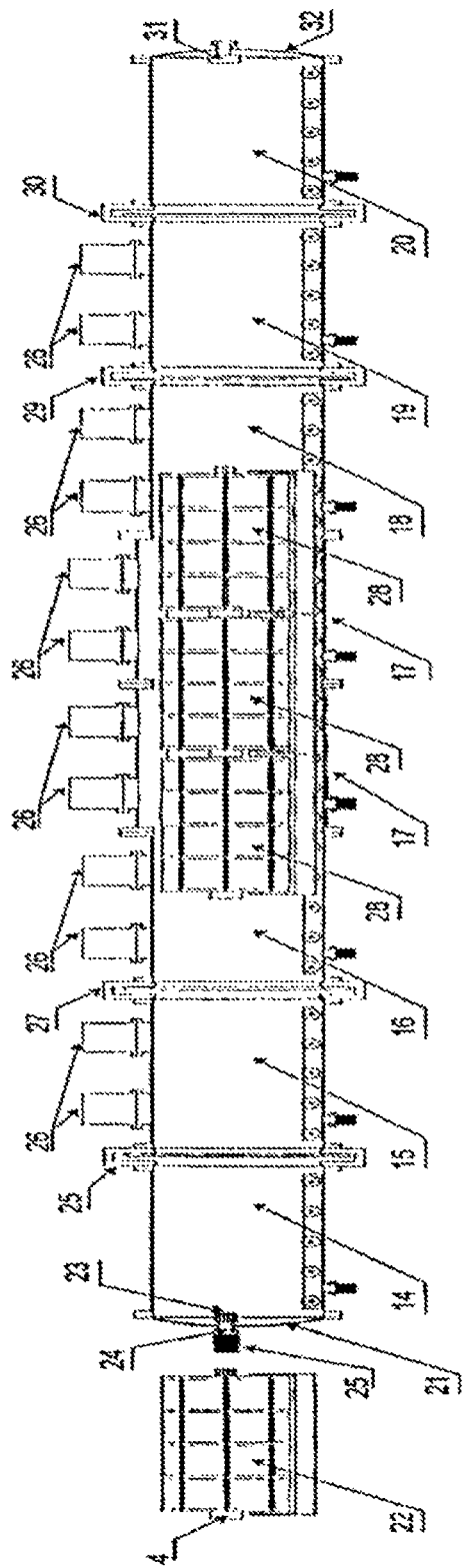
FIG. 6 shows the general drawing of the manufacturing line.

An example of distribution of applied thickness per one revolution from a single process device is shown on the graph (FIG. 1), where X-axis is in mm from the center of the device.

According to the shown graph, the length of the processing zone is 120 cm, while the length of border zones, where the thickness is reduced to zero, is approximately 10 cm.

At two revolutions of the substrate holder, while passing through the processing zone, the non-uniformity is approximately ±35%: the minimum thickness will be at a point, which will be at an edge and at a center of the processing zone, and the maximum thickness will be at one of the points, which will be subjected to the processing zone twice. A ratio of these thicknesses is roughly 1:2, which yields ±33% non-uniformity.

To achieve the required uniformity, it is required to reduce this value by 35 times, which will yield $2*\sqrt{35} \approx 12$ as an evaluation of required number of revolutions.

A more precise evaluation by the graph shows that at such a number of revolutions, the non-uniformity will be ±0.8%. Based on that, the rotational velocity of the substrate holder will be defined so the linear shift of the holder per one revolution should be no more than $120/12 \approx 10$ cm. At 1 m/min of forward movement speed, the rotational velocity will be at least 10 rpm. Other layers will have a better uniformity, since an application of two or more identical process devices is proportionally equivalent to an increase in rotational velocity, i.e. an improvement in uniformity.

An operation of the proposed manufacturing line may be represented by an example of an inline arrangement with a two-stage airlocking, including a substrate holder, vacuum lock, inlet airlock chamber of low vacuum, inlet airlock chamber of high vacuum, inlet buffer chamber, processing chamber, outlet buffer chamber, outlet airlock chamber of high vacuum, outlet airlock chamber of low vacuum, transportation system with driving rollers, high-vacuum pumps and process equipment.

The substrate holder consists of the drum (1), with bearings on the carriage (2). The substrates, for example, are held on plates (3) by any known method, which would ensure their reliable fastening during the drum rotation. The carriage is equipped by guides (10), positioned under the drum and installed on stands (11) made from a dielectric material.

In many cases, depending on the utilized manufacturing process, the carriage (2) may be designed in the following way:

as a cart, where linear guides are positioned under the drum;

suspended in air, where linear guides are positioned over the drum;

as a frame, where linear guides are positioned along the sides of the drum.

or in another way that would ensure a linear movement of the rotating cylinder.

Components of the removable magnetic coupling (4) and (5) are installed on the ends of the drum shaft. The coupling design is widely known. A first component of the removable coupling (4) consists of the soft magnetic hollow material, and magnets (6) are installed along its inner surface. Magnets are installed with alternating polarity, with magnetization direction shown on the drawing. The mating component of the magnetic coupling (5) consists of the soft magnetic cylinder with magnets (7), installed on its surface, the number of these magnets matching the number of magnets of the first component. Magnets are installed with alternating polarity, with magnetization direction shown on the drawing. There is a 5 mm gap between the magnets of the first and second components, which ensures that there is no contact when the coupling is rotated in cases of imprecise connection of substrate holders. A direct action electric motor is used to maintain the rotation of the drum. The motor actuator rotor (8) consists of the ring magnet with magnets on it. The motor actuator stator (9) with control unit is positioned on the carriage frame. The electric motor's power is supplied by direct current through linear guides of the carriage (10). For that, linear guides are installed on the insulated stands (11) of the carriage. The power to linear guides is supplied through the transportation system's rollers.

The manufacturing line consists of inlet airlock chamber of low vacuum (14), inlet airlock chamber of high vacuum (15), inlet buffer chamber (16), processing chambers (17) with process devices within them, outlet buffer chamber (18), outlet airlock chamber of high vacuum (19), and outlet airlock chamber of low vacuum (20). Process devices are installed along the movement of substrate holders, and the processing zone is determined by an area along the movement of substrate holders, where process devices are located, and within limits, where most of the applied material (more than 90%) by this device is deposited on a substrate holder.

Furthermore, several of process devices designated for depositing the same material, which partially or completely cover processing zones, are considered as one process device. If needed, some process devices, involved in the layer deposition, may be installed around substrate holders.

The holder (22), with substrates fastened to it, enters the inlet airlock chamber (14), after which the door (21) of the airlock chamber closes. After the door closes, the holder retreats and its removable coupling (4) connects to the mating part of the coupling (23), installed at the rotating shaft of the vacuum entrance, driven by an electric motor (24), installed on the airlock chamber door.

An electric motor spins the drum of the substrate holder up to the required rotational velocity. At the same time, the airlock chamber is pumped out to 10-20 Pa pressure.

After suction and drum spinning, a transport lock (25) unlocks, the substrate holder transfers to the inlet airlock chamber of high vacuum (15), and lock (25) closes. The airlock chamber of high vacuum is equipped with turbomolecular pumps (26), and suction to <0.01 Pa pressure occurs in it.

After the suction of the airlock chamber of high vacuum, the transportation lock (27) is unlocked, the substrate holder transfers to the inlet buffer chamber (16), and lock (27) closes. Within the buffer chamber, the substrate holder is slowed down to the process speed, and connects with substrate holder, introduced to the manufacturing line at the previous step. The magnetic couplings of substrate holders connecting, and rotation of the incoming substrate holder is synchronized with rotation of substrate holders (28), passing through process chambers. Inside the process chamber, the power is supplied to transportation system rollers, so the electric motors of substrate holders will maintain drum rotation.

Coating application on substrates occurs inside process chambers (17). During the substrate processing (within the processing zone), the drum rotates and moves evenly along its own axis. Substrate holders move through the processing zone with a minimal gap between each other.

Considering that the uniformity is mainly determined by a step shift per revolution, the ratio of the linear movement speed and rotational velocity of substrate holders is set so that every point of the surface of the substrate holder would make at least two full revolutions while passing through the processing zone. Therefore, the step shift per one revolution is quite small and allows obtaining high uniformity of applied coatings regardless of utilized types of process devices, including linear and precise ones.

The challenge to ensure the required rotational velocity of the substrate holder during processing, while simultaneously moving linearly, may be implemented by one of the following methods:

1. The substrate holder is spun up to the required speed, using an external drive in one of the inlet chambers, while the carriage is stationary, and later maintains its rotation due to inertia.
2. Every carriage is equipped with a low-voltage electric motor. The power to the electric motor is supplied through transportation system rollers or individual contact rollers on linear guides of the carriage, insulated from the carriage housing.
3. The substrate holder is spun to the required speed, using an external drive in one of the inlet chambers, while the carriage is stationary, and the carriage is equipped by a low-voltage electric motor, which is used to maintain the rotation, and may be low-powered.

To ensure the same rotational velocity for all substrate holders in the processing zone, they could be equipped with frictional or magnetic removable couplings, which ensure the transfer of rotation between neighboring substrate holders during their movement with minimum gaps.

To apply metal-dielectric and composite metal-dielectric coatings, besides the traditional ones for the pass-through equipment, can use one of the following methods, namely a multiple times application of thin metallic and under-oxidized layers with consequent oxidation.

The oxidation, in this case, means any reaction that leads to the formation of a chemical bond, for example, with oxygen, nitrogen, selenium, etc. For that, a special processing zone is formed, where process devices are installed around the holder, to apply one or more metals, and process device for oxidation, representing a source of an activated reactive gas (for example, a source of plasma). High vacuum suction, which ensures the gas separation between process device for oxidation and process devices for metal application, is installed in the processing zone.

When passing through this processing zone, every point of the processed surface passes many times through process devices that apply metals, where a super-thin material layer is applied, and passes through a process device for oxidation, where this layer is subjected to a full oxidation. After passing the processing zone, the processed surface is evenly coated by metal-dielectric or composite metal-dielectric coating with a specified content.

Process devices may apply one or assorted materials. In the latter case, the speeds of applying materials may be set differently to obtain a required coating content.

After passing through process chambers (17), the substrate holder enters the outlet buffer chamber (18).

The transportation lock (29) opens, the substrate holder speeds up, distancing itself from another substrate holder, following it, and moves to the outlet airlock chamber of high vacuum (19); after which, the lock (29) closes, the transportation lock (30) opens, and the substrate holder moves to the outlet airlock chamber of low vacuum (20), where the front component of the magnetic coupling of the holder connects with the mating component of the magnetic coupling (31), installed on the door. The magnetic coupling component (31) is installed on the shaft, whose rotation is made difficult due to friction.

The lock (30) closes, desiccated air is pumped into the chamber, and the pressure is raised to atmospheric. At the same time, due to the braking of the coupling (31), the substrate holder drum stoppage occurs.

After the pressure in the outlet airlock chamber (20) becomes equivalent to atmospheric, the chamber door (32) opens, and the substrate holder exits the manufacturing line.

What is claimed:
1. A manufacturing line for thin film coating comprising:
at least two substrate holders;
a low vacuum inlet airlock chamber;
a high vacuum inlet airlock chamber;
an inlet buffer chamber;
at least one processing chamber for coating a substrate;
an outlet buffer chamber;
a high vacuum outlet airlock chamber;
a low vacuum outlet airlock chamber;
a transportation system comprising transport locks and driving rollers;
high vacuum pumps;
airlock chamber doors; and
magnetic couplings;
wherein the high vacuum inlet airlock chamber is disposed after the low vacuum inlet airlock chamber, the inlet buffer chamber is disposed after the high vacuum inlet airlock chamber, at least one processing chamber is disposed after the inlet buffer chamber, the outlet buffer chamber is disposed after the at least one processing chamber, the high vacuum outlet airlock chamber is disposed after the outlet buffer chamber, the low vacuum outlet airlock chamber is disposed after the high vacuum outlet airlock chamber;
wherein a first transportation lock is disposed between the low vacuum inlet airlock chamber and the high vacuum inlet airlock chamber, a second transportation lock is disposed between the high vacuum inlet airlock chamber and the inlet buffer chamber; a third transportation lock is disposed between the outlet buffer chamber and the high vacuum outlet airlock chamber, and a fourth transportation lock is disposed between the high vacuum outlet airlock chamber and the low vacuum outlet airlock chamber;
wherein each substrate holder comprises a drum with bearings on a carriage that is equipped with guides disposed under the drum, stands, a motor actuator rotor, and plates; wherein each substrate holder is installed on the carriage coaxially to a direction of movement of the substrate holder through the manufacturing line, while the drums are designed to rotate with a constant angular speed and carriages are designed to move with a constant linear speed to ensure at least two full revolutions for each of the drum surface points while passing through a processing zone; and wherein the low vacuum inlet airlock chamber comprises a first airlock chamber door with a rotating shaft and an electric motor, and the low vacuum outlet airlock chamber comprises a second airlock chamber door with a rotating shaft.

2. The manufacturing line of claim 1, wherein the magnetic couplings are removable and installed on ends of the drum of the first substrate holder, on the substrate holder of the at least one processing chamber, and on the rotating shafts of the first airlock chamber door and the second airlock chamber door.

3. The manufacturing line of claim 2, wherein the high vacuum pumps are turbo-molecular pumps.

4. The manufacturing line of claim 1, wherein the electric motor is a direct drive motor.

* * * * *